(12) United States Patent
Zick

(10) Patent No.: US 11,545,963 B1
(45) Date of Patent: Jan. 3, 2023

(54) RING OSCILLATOR-BASED ISING MACHINE SYSTEM

(71) Applicant: Kenneth M. Zick, Arlington, VA (US)

(72) Inventor: Kenneth M. Zick, Arlington, VA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/540,985

(22) Filed: Dec. 2, 2021

(51) Int. Cl.
*G06F 17/11* (2006.01)
*G06N 7/00* (2006.01)
*G06Q 10/04* (2012.01)
*H03K 3/03* (2006.01)
*H03K 3/86* (2006.01)

(52) U.S. Cl.
CPC ........... *H03K 3/0322* (2013.01); *G06F 17/11* (2013.01); *G06N 7/005* (2013.01); *G06Q 10/047* (2013.01); *H03K 3/0315* (2013.01); *H03K 3/86* (2013.01)

(58) Field of Classification Search
CPC .......... G06F 17/00; G06F 17/10; G06F 17/11; G06N 7/005; G06Q 10/04; G06Q 10/047; H03K 3/0315; H03K 3/0322
See application file for complete search history.

(56) References Cited

U.S. PATENT DOCUMENTS 9,411,026 B2   8/2016   Yamamoto et al.
9,830,555 B2   11/2017  Marandi et al.
2017/0124477 A1*  5/2017   Wang .................... G06N 7/005
2021/0152125 A1*  5/2021   Chou .................... H03B 5/1228
2021/0312298 A1* 10/2021   Kim ..................... G06N 10/00

OTHER PUBLICATIONS

Ahmed et al., "A Probabilistic Self-annealing Compute Fabric based on 560 Hexagonally Coupled Ring Oscillators for Solving Combinatorial Optimization Problems," 2020 IEEE symposium on VLSI Circuits, Jun. 16-19, 2020.
Chou, et al.: "Analog Coupled Oscillator Based Weighted Ising Machine"; Scientific Reports, (2019) 9:14786 | https://doi.org/10.1038/s41598-019-49699-5.

(Continued)

*Primary Examiner* — Levi Gannon
(74) *Attorney, Agent, or Firm* — Tarolli, Sundheim, Covell & Tummino LLP

(57) ABSTRACT

One example includes an Ising machine system. The system includes a plurality of ring oscillators that are each configured to propagate an oscillation signal. Each of the ring oscillators can be cross-coupled with at least one other of the ring oscillators via a respective one of the oscillation signals to provide a respective phase coupling between the respective cross-coupled ring oscillators. The system also includes an Ising machine controller configured to generate control signals corresponding to parameters of an Ising problem and including a plurality of delay selection signals. The Ising machine controller can provide at least one of the delay selection signals to each of the ring oscillators. The delay selection signal can be configured to set a variable propagation delay of the ring oscillator to control the relative phase coupling of each of the ring oscillators to each of the at least one other of the ring oscillators.

20 Claims, 4 Drawing Sheets

(56) References Cited

OTHER PUBLICATIONS

I. Ahmed, P. Chiu, W. Moy, and C.H. Kim, "A Probabilistic Compute Fabric Based on Coupled Ring Oscillators for Solving Combinatorial Optimization Problems", IEEE Journal of Solid-State Circuits (JSSC), 2021.

Wang et al., "OIM: Oscillator-based Ising Machines for Solving Combinatorial Optimisation Problems," Unconventional Computation and Natural Computation, 2019, as well as Chou et al., Analog coupled oscillator based weighted Ising machine, Scientific Reports 9, article 14786 (2019)).

* cited by examiner

PROVIDE AN ISING MACHINE SYSTEM COMPRISING A PLURALITY OF COMPLEMENTARY METAL-OXIDE SEMICONDUCTOR (CMOS) RING OSCILLATORS THAT ARE EACH CONFIGURED TO PROPAGATE AN OSCILLATION SIGNAL — 802

PROVIDE A SET OF CONTROL SIGNALS CORRESPONDING TO PARAMETERS OF AN ISING PROBLEM TO EACH OF THE CMOS RING OSCILLATORS — 804

US 11,545,963 B1

RING OSCILLATOR-BASED ISING MACHINE SYSTEM

TECHNICAL FIELD

The present invention relates generally to computer systems, and specifically to a ring-oscillator based Ising machine system.

BACKGROUND

Ising machines are a type of specialized computer system for solving a variety of specialty problems, known as Ising problems or non-deterministic polynomial-time hard (NP-hard) problems. One such example is the "traveling salesman problem" that is a general term for an optimization problem. Such Ising problems are evaluated on the principles of the Ising model, or the Ising problem Hamiltonian: $H(\sigma) = -\Sigma h_i \sigma_i - \Sigma J_{ij} \sigma_i \sigma_j$. Such specialty Ising machines operate based on implementing a large number of variables to provide high-quality answers to certain combinatorial optimization problems extremely quickly. Typical Ising machines implement a number of elements (e.g., oscillators) that interact with other elements in the Ising machine to provide cross-coupled effects that can be implemented to solve the Ising problem based on such cross-coupled effects.

SUMMARY

One example includes an Ising machine system. The system includes a plurality of ring oscillators that are each configured to propagate an oscillation signal. Each of the ring oscillators can be cross-coupled with at least one other of the ring oscillators via a respective one of the oscillation signals to provide a respective phase coupling between the respective cross-coupled ring oscillators. The system also includes an Ising machine controller configured to generate control signals corresponding to parameters of an Ising problem and including a plurality of delay selection signals. The Ising machine controller can provide at least one of the delay selection signals to each of the ring oscillators. The delay selection signal can be configured to set a variable propagation delay of the ring oscillator to control the relative phase coupling of each of the ring oscillators to each of the at least one other of the ring oscillators.

Another example includes a method for solving an Ising problem. The method includes providing an Ising machine system comprising a plurality of complementary metal-oxide semiconductor (CMOS) ring oscillators that are each configured to propagate an oscillation signal. Each of the CMOS ring oscillators can be cross-coupled with at least one other of the CMOS ring oscillators via a respective one of the oscillation signals to provide a respective phase coupling between the respective cross-coupled CMOS ring oscillators. The method also includes providing a set of control signals corresponding to parameters of an Ising problem to each of the CMOS ring oscillators. Each of the sets of control signals can include a delay selection signal configured to set a variable propagation delay of the respective one of the CMOS ring oscillators to control the relative phase coupling of each of the CMOS ring oscillators to each of the at least one other of the CMOS ring oscillators.

Another example includes an Ising machine system. The system includes a plurality of ring oscillators that are each configured to propagate an oscillation signal. Each of the ring oscillators can include a plurality of coupling stages. Each of the ring oscillators can be cross-coupled with at least one other of the ring oscillators via the respective one of the oscillation signals provided from one of the respective coupling stages associated with the respective one of the ring oscillators and received from a respective one of the coupling stages associated with the respective at least one other of the ring oscillators to provide the respective phase coupling between the respective cross-coupled ring oscillators. The system further includes an Ising machine controller configured to generate a plurality of sets of control signals corresponding to parameters of an Ising problem. Each of the sets of control signals can include a delay selection signal associated with a variable propagation delay. The Ising machine controller can provide each set of the control signals to each of the coupling stages of each of the ring oscillators, such that each of the ring oscillators has a net oscillation period of the respective oscillation signal at a given instant that is set based on the variable oscillation provided by the respective delay selection signal at each of the coupling stages of the respective one of the ring oscillators to control the relative phase coupling of each of the ring oscillators to each of the at least one other of the ring oscillators.

DETAILED DESCRIPTION

The present invention relates generally to computer systems, and specifically to a ring-oscillator based Ising machine system. The Ising machine system can be implemented in any of a variety of applications to solve complex Ising problems, such as optimization problems (e.g., "the traveling salesman problem"). The Ising machine system includes a plurality of ring oscillators that are each configured to propagate an oscillation signal. As an example, each of the ring oscillators can be formed from complementary metal-oxide semiconductor (CMOS) fabrication techniques, such as including logic-gates formed from CMOS, application specific integrated circuits (ASICs), and/or field-programmable gate arrays (FPGAs). The ring oscillators can each include a plurality of coupling stages that are each configured to receive an oscillation signal from one of the other ring oscillators, and can likewise provide an oscillation signal to the other ring oscillator. The oscillation signal of a given ring oscillator can affect the relative phase relationship between the respective ring oscillators. Therefore, each of the ring oscillators can be coupled to at least one other ring oscillator in a cross-coupled manner to provide a respective dynamic phase coupling between the respective ring oscillators.

The Ising machine system can also include an Ising machine controller that is configured to generate a plurality of sets of control signals that are provided to the ring oscillators. As an example, the Ising machine controller can provide a set of the control signals to each of the coupling stages of each of the ring oscillators. The control signals can include a delay selection signal that can set a variable propagation delay of the ring oscillator to control the relative dynamic phase coupling of each of the ring oscillators to each of the at least one other of the ring oscillators. Because each of the control stages of a given ring oscillator can receive a delay selection signal, the net oscillation period of the given ring oscillator at a given instant can be set based on the delay selection signals provided to each of the control stages. The control signals can include additional signals for controlling a given coupling stage of a given ring oscillator, such as selective enablement of dynamic phase coupling of the coupling to other ring oscillator(s) and/or selectively providing reference clocks and/or simulated noise signals to the coupling stages for phase alignment to the reference clocks and/or simulated noise signals. Accordingly, the Ising machine system described herein can implement a greater variety of inputs for solving an Ising problem to facilitate a more efficient and rapid solution for the Ising problem.

Figure 1:
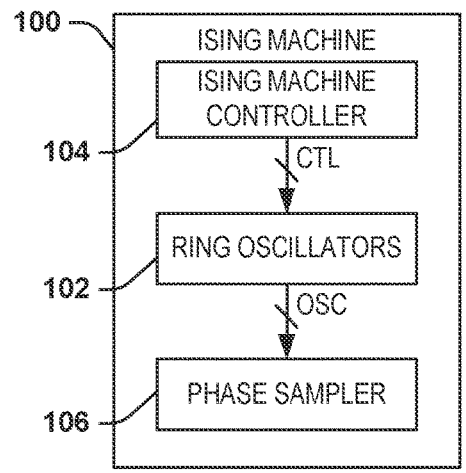
FIG. 1 illustrates an example block diagram of an Ising machine.

FIG. 1 illustrates an example block diagram of an Ising machine system 100. The Ising machine system 100 can be implemented in any of a variety of specialty computing environments to solve an Ising problem that requires evaluation of a large number of variables. As an example, the Ising machine system 100 can be implemented to solve a complex optimization problem (e.g., "the traveling salesman problem").

The Ising machine system 100 includes a plurality of ring oscillators 102 and an Ising machine controller 104. The ring oscillators 102 can be implemented as any of a variety of different types of ring oscillators. As an example, the ring oscillators 102 can be formed from complementary metal-oxide semiconductor (CMOS) fabrication techniques, such as including logic-gates formed from CMOS, application specific integrated circuits (ASICs), and/or field-programmable gate arrays (FPGAs). Each of the ring oscillators 102 can thus propagate an oscillation signal, demonstrated in the example of FIG. 1 generally as a set of oscillation signals OSC. As an example, each of the ring oscillators 102 can be cross-coupled to another one of the ring oscillators 102 via the respective oscillation signals OSC, such as to provide dynamic phase coupling between the respective cross-coupled ring oscillators 102. As described herein, the term "phase coupling" refers to the phase characteristic of a given one of the ring oscillators 102 being dependent on the phase characteristic of another one of the ring oscillators 102. As an example, the phase coupling can include a tendency toward phase alignment or phase anti-alignment between the respective oscillation signals OSC of cross-coupled ring oscillators 102. As also described herein, the phase coupling is referred to as dynamic because the Ising machine system 100 operates in a substantially constantly changing manner with respect to the phase relationships between the ring oscillators. As described in greater detail herein, the ring oscillators 102 can be controlled by delay selection signals that can control an amount of delay of the oscillations of a given ring oscillator, and therefore an oscillation period of the given ring oscillator. As an example, the delay selection signal can include multiple discrete variations of each of more delay or less delay relative to a nominal amount of delay. As described herein, the term "oscillation period" refers to a total time of a given node of the respective ring oscillator to change from a first logic state to a second logic state, and to change from the second logic state back to the first logic state. For example, the ring oscillators 102 can be fabricated to provide an odd number of logical inversions around a complete revolution.

In the example of FIG. 1, the Ising machine controller 104 is configured to provide a plurality of control signals, demonstrated as "CTL", to the ring oscillators 102. As an example, the control signals CTL can be provided as sets to each of the ring oscillators 102, such that the control signals CTL correspond to parameters of an Ising problem to be solved by the Ising machine system 100. As an example, the control signals CTL can include a delay selection signal that is provided to each of the ring oscillators 102. As another example, a distinct delay selection signal can be provided to each of the coupling stages of each of the ring oscillators 102, such that the net oscillation period of each of the ring oscillators 102 at a given instant can be set based on the collective contribution of each of the delay selection signals provided to each of the respective coupling stages of a given ring oscillator 102. The control signals CTL can include additional signals, as well, such as selective enablement of phase coupling of the coupling to other ring oscillator(s) 102 and/or selectively providing reference clocks and/or simulated noise signals to the coupling stages for phase alignment to the reference clocks and/or simulated noise signals.

As described in greater detail herein, the variable delay of each of the coupling stages of each of the ring oscillators 102, as set by the delay selection signal, can provide a variable strength or weight to the cross-coupling between respective ring oscillators 102. As a result, the phase coupling between the ring oscillators 102 can be controlled with respect to the timing of phase alignment or phase anti-alignment. In other words, the variable delay of a given coupling stage, as set by the respective delay selection signal, can provide variability as to the speed at which a given pair of cross-coupled ring oscillators 102 converge or diverge with respect to phase. Therefore, the delay selection signals can provide an additional degree of control of the Ising variables for solving the Ising problem. Accordingly, the Ising machine system 100 described herein can implement a greater variety of inputs for solving an Ising problem to facilitate a more efficient and rapid solution for the Ising problem relative to typical Ising machines.

The Ising machine system 100 further includes a phase sampler 106. The phase sampler 106 can be configured to monitor a logic state of each of the oscillation signals of each of the ring oscillators 102 to facilitate solutions for a given Ising problem. For example, to provide a solution for a given Ising problem, the Ising machine system 100 can operate for a duration of time (e.g., as determined by any of a variety of machine parameters or other circumstances, such as empirical observations and/or real-time constraints), and the phases of the ring oscillators 102 can be sampled by the phase sampler 106 (e.g., via the oscillation signals OSC). The sampled phases of the ring oscillators 102 can be read by the phase sampler 106 as a set of data that can represent a solution to the Ising problem. As an example, the Ising machine system 100 can provide some post-processing on the set of data or can determine the solution based on the set of raw data itself to achieve a solution to the Ising problem corresponding to a complex combinatorial optimization problem. As described above, the delay selection signals provided by the Ising machine control system 104 can provide for an additional degree of control in providing a solution to the Ising problem not provided by typical Ising machines.

Figure 2:
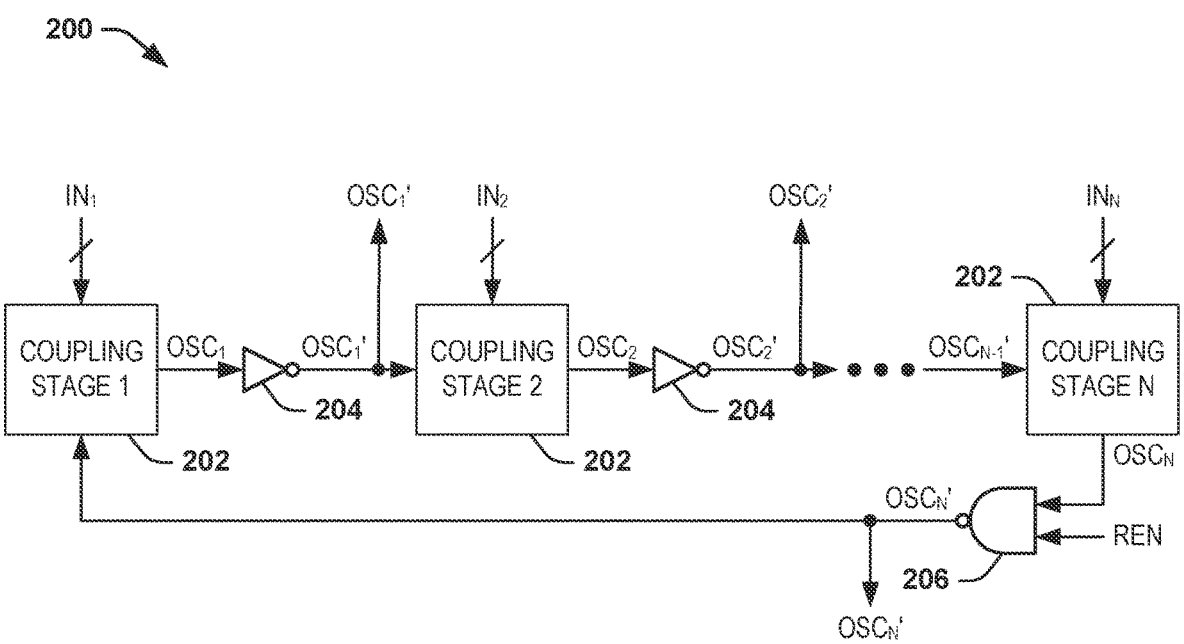
FIG. 2 illustrates an example diagram of a ring oscillator.

FIG. 2 illustrates an example diagram of a ring oscillator 200. The ring oscillator 200 can correspond to one of the ring oscillators 102 in the example of FIG. 1. Therefore, reference is to be made to the example of FIG. 1 in the following description of the example of FIG. 2.

The ring oscillator 200 includes a plurality N of coupling stages 202, where N is a positive integer. The coupling stages 202 are each interconnected by an inverter 204, which can be implemented as a CMOS inverter (e.g., with complementary pull-up and pull-down transistor switches). The ring oscillator 200 is configured to propagate an oscillation signal OSC. As an example, N can be an odd integer, such that the oscillation signal OSC exhibits an odd number of logical inversions around a complete revolution of the ring oscillator 200.

In the example of FIG. 2 as oscillation signals $OSC_1$ through $OSC_N$ provided from the coupling stages 202, and as oscillation signals $OSC_1'$ and $OSC_N'$ as provided from the inverters 204. Thus, a given Yth oscillation signal $OSC_Y'$ corresponds to an inverted version of the respective Yth oscillation signal $OSC_Y$. Furthermore, a given Yth oscillation signal $OSC_Y$ provided from the Yth coupling stage 202 corresponds to the oscillation signal $OSC_{Y-1}'$ that is provided as an input to the respective Yth coupling stage 202. As described herein, the coupling stages 202 can provide a variable propagation delay of the oscillation signal $OSC_{Y-1}'$ to provide the oscillation signal $OSC_Y$.

Additionally, each of the coupling stages 202 is demonstrated as receiving a set of input signals IN, demonstrated as $IN_1$ through $IN_N$. The input signals IN can each include an oscillator signal OSC provided from a coupling stage of another ring oscillator 102. The input signals IN can also include a set of the control signals CTL provided from the Ising machine controller 104. As described above, the control signals CTL, and thus each of the sets of input signals IN, can include a delay selection signal that can affect a propagation delay of the oscillator signal OSC through the coupling stage 202. The delay selection signal can thus affect an amount of delay between the oscillation signal $OSC_{Y-1}'$ and the oscillation signal $OSC_Y$, and thus the amount of propagation delay of the oscillation signal OSC through the respective one of the coupling stages 202. As an example, each of the coupling stages 202 can exhibit a nominal delay of the oscillation signal OSC, and can include variable delay that can be set by the delay selection signal to provide for a faster propagation (e.g., less delay) or slower propagation (e.g., more delay) of the oscillation signal OSC through the respective coupling stage 202. The overall propagation delay of the oscillation signal OSC (e.g., the time duration of N oscillations) about the ring oscillator 200 is thus defined by the net propagation delay of each of the coupling stages 202 at a given instant, as provided by the respective delay selection signals.

As also described above, the control signals CTL can include a variety of additional signals for controlling operation of each of the coupling stages 202, and thus the ring oscillator 200. Therefore, the input signals IN can likewise include a variety of additional signals for controlling operation of each of the coupling stages 202, and thus the ring oscillator 200. Such additional signals are described in greater detail herein.

In addition, in the example of FIG. 2, the ring oscillator 200 includes a NAND gate 206 that interconnects the Nth coupling stage 202 and the first coupling stage 202. The NAND gate 206 receives the oscillation signal $OSC_N$ at a first input, and also receives a ring oscillator enable signal REN at a second input. The ring oscillator enable signal REN can correspond to an enable signal for the entire ring oscillator 200, such that the ring oscillator 200 can be selectively enabled and disabled with respect to propagating the oscillation signal OSC. As an example, the ring oscillator enable signal REN can be provided as one of the control signals CTL that is provided from the Ising machine control system 104 to the ring oscillator 200. Therefore, in response to assertion of the ring oscillator enable signal REN, the ring oscillator 200 can provide the oscillation signal OSC as described herein. However, in response to de-assertion of the ring oscillator enable signal REN, the ring oscillator 200 can be disabled, such that the oscillation signal OSC ceases propagation (e.g., maintains a logic-zero state between each of the coupling stages 202).

Figure 3:
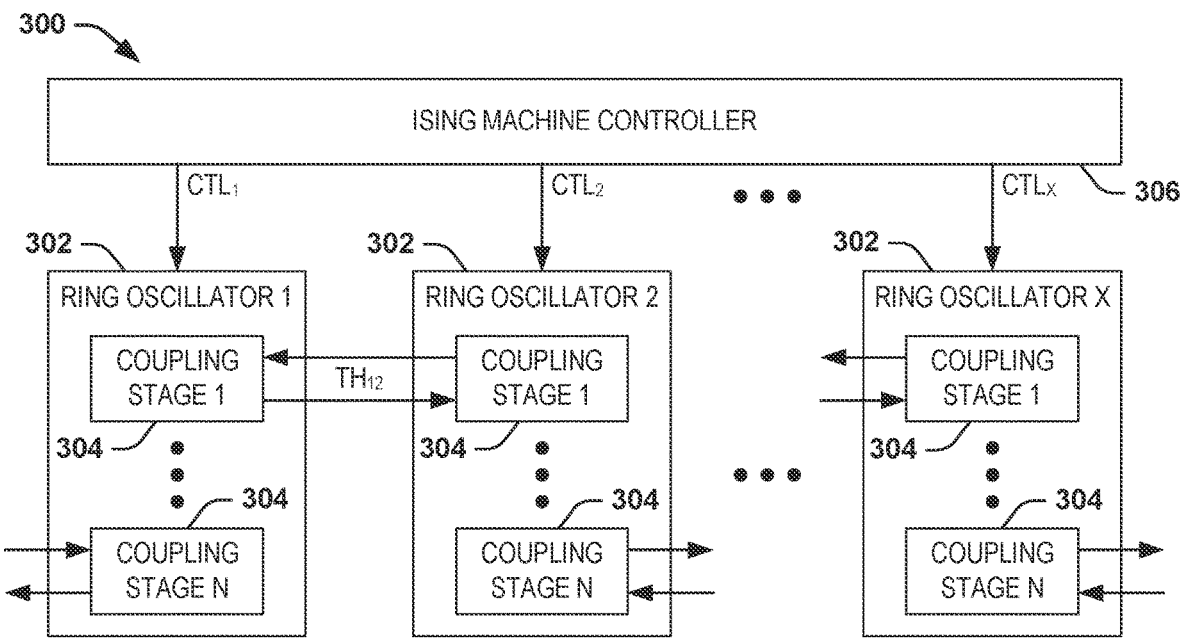
FIG. 3 illustrates another example block diagram of an Ising machine.

FIG. 3 illustrates another example block diagram of an Ising machine 300. The Ising machine system 300 can correspond to the Ising machine system 100 in the example of FIG. 1. In the example of FIG. 3, the Ising machine system 300 is demonstrated as including a quantity X of ring oscillators 302. Each of the ring oscillators 302 can correspond to the ring oscillator 200 in the example of FIG. 2. Therefore, reference is to be made to the example of FIGS. 1 and 2 in the following description of the example of FIG. 3.

The ring oscillators 302 can be implemented as any of a variety of different types of ring oscillators, such as CMOS ring oscillators. Each of the ring oscillators 302 can thus propagate an oscillation signal OSC, similar to as described above. In the example of FIG. 3, each of the ring oscillators 302 includes a plurality N of coupling stages 304.

The Ising machine controller 306 is configured to provide a plurality of control signals, demonstrated as $CTL_1$ to the $CTL_X$, to the ring oscillators 302. As an example, each of the control signals $CTL_1$ through $CTL_X$ can be provided as multiple sets of control signals to each of the ring oscillators 302, such that each of the sets of control signals is provided to a respective one of the coupling stages 304. As described above, the control signals $CTL_1$ through $CTL_X$ correspond to parameters of an Ising problem to be solved by the Ising machine system 300. As an example, each of the sets of control signals $CTL_1$ through $CTL_X$ can include a ring oscillator enable signal REN, as described above in the example of FIG. 2. As another example, each of the sets of control signals of each of the control signals $CTL_1$ through $CTL_X$ can include a delay selection signal that is provided to each of the respective coupling stages 304. Therefore, the net oscillation period of each of the ring oscillators 302 at a given instant can be set based on the collective contribution of each of the delay selection signals provided to each of the respective coupling stages 304 of a given one of the ring oscillators 302 at the given instant.

In the example of FIG. 3, each of the ring oscillators 302 can be cross-coupled to another one of the ring oscillators 302 via the respective oscillation signals, such as to provide phase coupling between the respective cross-coupled ring oscillators 302. In the example of FIG. 3, the first ring oscillator 302 ("RING OSCILLATOR 1") is cross-coupled to the second ring oscillator 302 ("RING OSCILLATOR 2") via respective first coupling stages 304 ("COUPLING STAGE 1"). As described herein, the cross-coupling between coupling stages 304 is with respect to the oscillation signals OSC' (e.g., provided from the inverters 204) that are input to the respective coupling stages 304. Therefore, with reference to the example of FIG. 2, the first coupling stage 304 of the first ring oscillator 302 receives the respective oscillation signal $OSC_N'$ from the Nth coupling stage 304 of the second ring oscillator 302, and the first coupling stage 304 of the second ring oscillator 302 receives the respective oscillation signal $OSC_N'$ from the Nth coupling stage 304 of the first ring oscillator 302. The cross-coupling between first and second ring oscillators 302 corresponding to the respective oscillation signals $OSC_N'$ is demonstrated in the example of FIG. 3 as bi-directional signals $TH_{12}$. Therefore, the signals $TH_{12}$ provide for phase coupling of the first and second ring oscillators 302.

In the example of FIG. 3, each of the coupling stages 304 of each of the ring oscillators 302 can be cross-coupled to other respective ring oscillators 302. For example, each of or most of the N coupling stages 304 of a given one of the ring oscillators 302 can be cross-coupled to the coupling stage 304 of one other distinct and separate one of the other ring oscillators 302. Therefore, the cross-coupling between respective ring oscillators 302 corresponds to the respective oscillation signals OSC' being provided to each of the respective coupling stages 304 to provide for phase coupling of the respective 302, similar to as described above regarding the signals $TH_{12}$ between the cross-coupled first and second ring oscillators 302.

Figure 4:
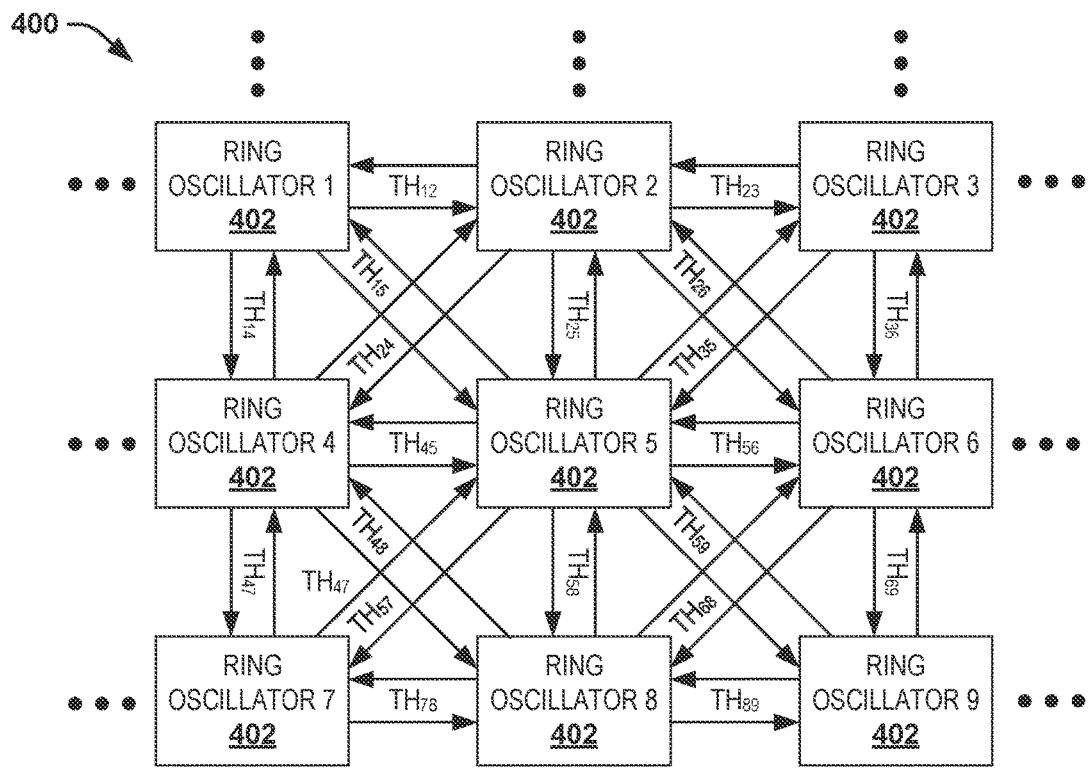
FIG. 4 illustrates another example block diagram of an Ising machine.

FIG. 4 illustrates another example block diagram 400 of an Ising machine. The Ising machine system in the diagram 400 can correspond to the Ising machine systems 100 and 300 of the respective examples of FIGS. 1 and 3. Therefore, reference is to be made to the examples of FIGS. 1-3 in the following description of the example of FIG. 4.

The diagram 400 demonstrates an array of nine ring oscillators 402 ("RING OSCILLATOR 1" through "RING OSCILLATOR 9") and the cross-coupling between the ring oscillators 402. The quantity of ring oscillators 402 can be greater than nine, and can extend the array in any or all of the two-dimensional directions, as indicated in the example of FIG. 4. As an example, each of the ring oscillators 402 can be arranged substantially similar (e.g., identical) with respect to each other. Therefore, each of the ring oscillators 402 can include an equal quantity (e.g., quantity N) of coupling stages (e.g., the coupling stages 202 or 304).

In the example of FIG. 4, the first ring oscillator 402 ("RING OSCILLATOR 1") is cross-coupled to the second ring oscillator 402 ("RING OSCILLATOR 2") via respective first coupling stages. Therefore, similar to as described above, the first coupling stage (e.g., the first coupling stage 304) of the first ring oscillator 402 receives the respective oscillation signal $OSC_N'$ from the Nth coupling stage (e.g., the Nth coupling stage 304) of the second ring oscillator 402, and the first coupling stage of the second ring oscillator 402 receives the respective oscillation signal $OSC_N'$ from the Nth coupling stage of the first ring oscillator 402. The cross-coupling between first and second ring oscillators 402 corresponding to the respective oscillation signals $OSC_N'$ is demonstrated in the example of FIG. 4 as bi-directional signals $TH_{12}$. Therefore, the signals $TH_{12}$ provide for phase coupling of the first and second ring oscillators 402.

Similarly, the second ring oscillator 402 ("RING OSCILLATOR 2") is cross-coupled to the third ring oscillator 402 ("RING OSCILLATOR 3") via respective second coupling stages. Therefore, as a similar example to the above, the second coupling stage of the second ring oscillator 402 receives the respective oscillation signal $OSC_1'$ from the first coupling stage of the third ring oscillator 402, and the second coupling stage of the third ring oscillator 402 receives the respective oscillation signal $OSC_1'$ to the first coupling stage 404 of the second ring oscillator 402. The cross-coupling between second and third ring oscillators 402 corresponding to the respective oscillation signals $OSC_2'$ is demonstrated in the example of FIG. 4 as bi-directional signals $TH_{23}$. Therefore, the signals $TH_{23}$ provide for phase coupling of the second and third ring oscillators 402.

The diagram 400 thus demonstrates the cross-coupling of the respective ring oscillators 402 with respect to the oscillation signals OSC based on the bidirectional signals $TH_{YZ}$ for a given Yth ring oscillator 402 and a given Zth ring oscillator 402. Cross-coupling between ring oscillators 402 is not limited to cross-coupling between adjacent or diagonal ring oscillators 402, but could occur in any of a variety of combinations of the ring oscillators 402. As an example, the cross-coupling of a given ring oscillator 402 to another given ring oscillator 402 can be with respect to a same coupling stage for each of the respective ring oscillators 402. As a result, each of the ring oscillators 402 can provide phase coupling to multiple other ring oscillators 402 at each of different respective coupling stages. The contribution of phase coupling of a given one ring oscillator 402 to another ring oscillator 402 can be based on a different weighted strength (e.g., different propagation time) or a different polarity (e.g., phase alignment versus phase anti-alignment) than other ring oscillators 402 with which the respective ring oscillator 402 is cross-coupled, such as based on the respective control signals CTL that are provided from the Ising machine controller (e.g., the Ising machine controller 306) to the respective coupling stages of the respective ring oscillators 402. Accordingly, the Ising machine system in the diagram 400 can operate with a large variation of phase coupling between the ring oscillators 402.

Figure 5:
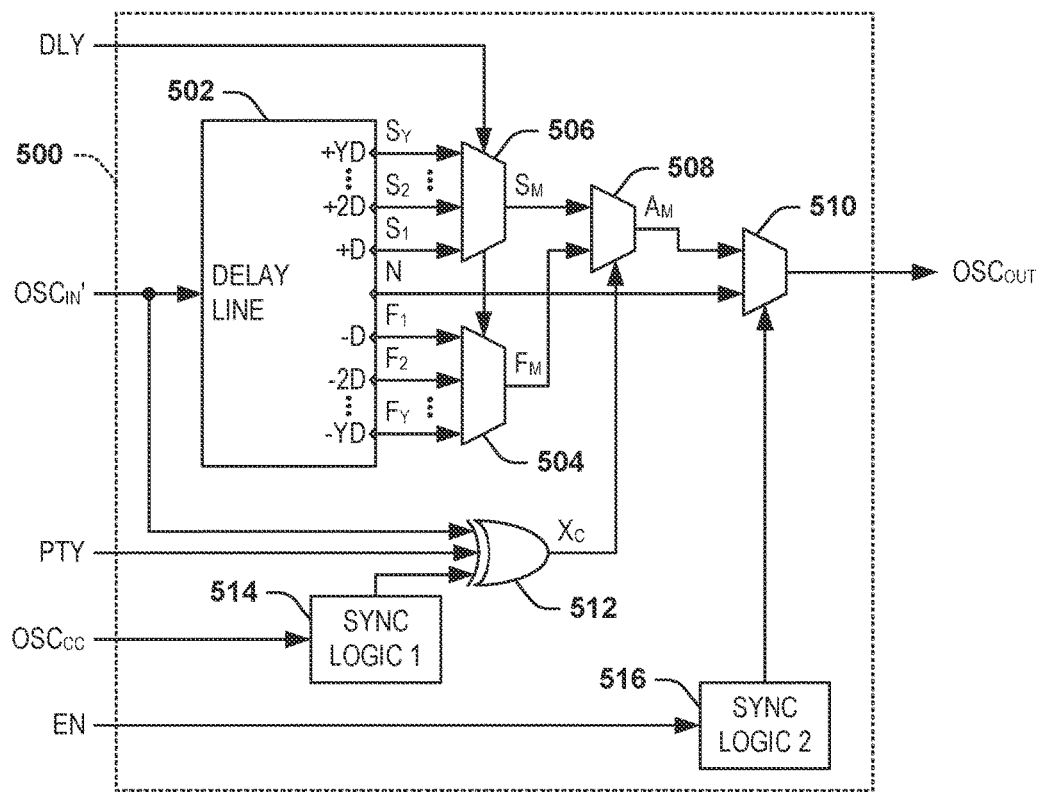
FIG. 5 illustrates an example diagram of a coupling stage.

FIG. 5 illustrates an example diagram of a coupling stage 500. The coupling stage 500 can correspond to the coupling stages 202 or the coupling stages 304 in the respective examples of FIGS. 2 and 3. Therefore, reference is to be made to the examples of FIGS. 2 and 3 in the following description of the example of FIG. 5.

The coupling stage 500 includes a delay line 502 that is configured to receive an input oscillation signal $OSC_{IN}'$ that can correspond to an oscillation signal OSC' provided from an inverter (e.g., one of the inverters 204). The input oscillation signal $OSC_{IN}'$ is thus split into a plurality of oscillation signals that are each delayed by different durations of time through the delay line 502. In the example of FIG. 5, the delay line 502 is configured to provide the input oscillation signal $OSC_{IN}'$ at a nominal delay, demonstrated by the signal N. Therefore, the nominal delay signal N corresponds to the input oscillation signal $OSC_{IN}'$ having been delayed by a nominal predetermined time duration.

The delay line 502 is also configured to provide the input oscillation signal $OSC_{IN}'$ at a plurality Y of different multiples "D" of delay that are both faster and slower than the nominal delay signal N with respect to the amount of delay. In the example of FIG. 5, the delay line 502 provides a set of fast delay signals (e.g., having less time delay than the nominal delay signal N) demonstrated as signals $F_1$ through $F_Y$. Therefore, each of the signals $F_1$ through $F_Y$ are faster (e.g., less delayed) than the nominal delay signal N by multiples 1 through Y of the discrete delay amount "−D" (e.g., negative to denote subtracting delay). Similarly, the delay line 502 provides a set of slow delay signals (e.g., having more time delay than the nominal delay signal N) demonstrated as signals $S_1$ through $S_Y$. Therefore, each of the signals $S_1$ through $S_Y$ are slower (e.g., more delayed) than the nominal delay signal N by multiples 1 through Y of the discrete delay amount "+D" (e.g., positive to denote adding delay). As a result, the delay of the fast delay signals $F_1$ through $F_Y$ and the delay of the slow delay signals $S_1$ through $S_Y$ are symmetric with respect to an amount of delay about the nominal delay signal N.

The delay signals N, $F_1$ through $F_Y$, and $S_1$ through $S_Y$ are provided to a set of multiplexers. In the example of FIG. 5, the fast delay signals $F_1$ through $F_Y$ are provided to a first multiplexer 504 and the slow delay signals $S_1$ through $S_Y$ are provided to a second multiplexer 506. The first multiplexer 504 is configured to select one of the fast delay signals $F_1$ through $F_Y$ as an output, demonstrated as $F_M$. Similarly, the second multiplexer 506 is configured to select one of the slow delay signals $S_1$ through $S_Y$ as an output, demonstrated as $S_M$. The selection of the fast delay signals $F_1$ through $F_Y$ as the signal $F_M$ and the selection of the slow delay signals $S_1$ through $S_Y$ as the signal $S_M$ is provided based on a delay selection signal DLY. The delay selection signal DLY can be provided as one of the control signals CTL from the Ising machine controller 306, and is demonstrated as being provided to the multiplexers 504 and 506 to select the corresponding outputs $F_M$ and $S_M$ from the respective multiplexers 504 and 506. While the example of FIG. 5 demonstrates two distinct multiplexers 504 and 506, a single multiplexer can instead be implemented for selecting one of the fast and slow delay signals $F_1$ through $F_Y$ and $S_1$ through $S_Y$.

The signals $F_M$ and $S_M$ are provided to a third multiplexer 508 that is configured to select between the signals $F_M$ and $S_M$. Therefore, the multiplexer 508 selects between the selected fast delay signal $F_M$ and the selected slow delay signal $S_M$ to provide an adjusted delay signal $A_M$. The adjusted delay signal $A_M$ is provided to a fourth multiplexer 510 that is configured to select between the adjusted delay signal $A_M$ and the nominal delay signal N. Therefore, the multiplexer 510 selects between the adjusted delay signal $A_M$ and the nominal delay signal N to provide an output oscillation signal $OSC_{OUT}$. The output oscillation signal $OSC_{OUT}$ therefore corresponds to a delayed version of the input oscillation signal $OSC_{IN}'$.

The coupling stage 500 also includes an XOR gate 512 that is configured to generate a selection signal $X_C$. The selection signal $X_C$ is provided to the third multiplexer 508 to provide the selection between the selected fast delay signal $F_M$ and the selected slow delay signal $S_M$ to provide the adjusted delay signal $A_M$. The XOR gate 512 receives the oscillation input signal $OSC_{IN}'$ at a first input and receives a polarity signal PTY at a second input. The polarity signal PTY can correspond to one of the control signals CTL that is provided from the Ising machine controller 306, and can define the polarity of the coupling stage 500 with respect to alignment or anti-alignment of the phase coupling of the respective ring oscillator with the cross-coupled ring oscillator. As an example, the polarity signal PTY can be set to a logic-1 to set the coupling stage 500 to phase align with the cross-coupled ring oscillator, or can be set to a logic-0 to set the coupling stage 500 to phase anti-align with the cross-coupled ring oscillator.

The XOR gate 512 also receives the oscillation signal $OSC_{CC}$ that is provided from the cross-coupled ring oscillator. Thus, the input oscillation signal $OSC_{IN}'$ and the oscillation signal $OSC_{CC}$ provided from the other cross-coupled ring oscillator can form a signal set of $TH_{YZ}$, as described above in the example of FIG. 4. In the example of FIG. 5, the oscillation signal $OSC_{CC}$ is provided to the XOR gate 512 through a first synchronous logic block ("SYNC LOGIC 1") 514, which can correspond to one or more flip-flop devices to mitigate metastability and/or logic glitches. Alternatively, the oscillation signal $OSC_{CC}$ can be provided directly to the XOR gate 512, such as to reduce chip fabrication area.

Therefore, in response to the oscillation input signal $OSC_{IN}'$, the polarity signal PTY, and the oscillation signal $OSC_{CC}$, the XOR gate 512 can provide the selection signal $X_C$ as an oscillation signal to provide the adjusted delay signal $A_M$ as oscillating between the selected fast delay signal $F_M$ and the selected slow delay signal $S_M$ to provide throttling of the coupling stage 500 based on the relative phases of the oscillation input signal $OSC_{IN}'$ and the oscillation signal $OSC_{CC}$. For example, in response to the polarity signal PTY being set to a state corresponding to phase alignment (e.g., logic-1), the oscillating adjusted delay signal $A_M$ is provided as the output oscillation signal $OSC_{OUT}$ (e.g., via the multiplexer 510, as described in greater detail herein) in a manner that attempts to align (e.g., converge) the phase of the input oscillation signal $OSC_{IN}'$ with the oscillation signal $OSC_{CC}$. Similarly, in response to the polarity signal PTY being set to a state corresponding to phase anti-alignment (e.g., logic-0), the oscillating adjusted delay signal $A_M$ is provided as the output oscillation signal $OSC_{OUT}$ in a manner that attempts to anti-align (e.g., diverge) the phase of the input oscillation signal $OSC_{IN}'$ with the oscillation signal $OSC_{CC}$. The convergence/divergence of the phase coupling of the input oscillation signal $OSC_{IN}'$ to the oscillation signal $OSC_{CC}$ to provide the output oscillation signal $OSC_{OUT}$ can be an iterative process that can take an amount of time that is based on the weighting of the propagation delay of the oscillation output signal $OSC_{OUT}$ with respect to the input oscillation signal $OSC_{IN}'$, as set by the delay selection signal DLY. Therefore, the delay selection signal DLY can provide an additional layer of control over the phase coupling between cross-coupled ring oscillators.

The oscillating adjusted delay signal $A_M$ is provided as the output oscillation signal $OSC_{OUT}$ in response to one state of the multiplexer 510. In the example of FIG. 5, the multiplexer 510 is controlled by an enable signal EN that is provided to a second synchronous logic block ("SYNC LOGIC 2") 516. As an example, the second synchronous logic block 516 can correspond to one or more flip-flop devices to mitigate metastability and/or logic glitches. Alternatively, the enable signal EN can be provided directly to the multiplexer 510, such as to reduce chip fabrication area. The enable signal EN can be provided as one of the control signals CTL from the Ising machine controller 306.

The enable signal EN can thus set a state of the multiplexer 510 to provide either the oscillating adjusted delay signal $A_M$ as the output oscillation signal $OSC_{OUT}$ or the nominal delay signal N as the output oscillation signal $OSC_{OUT}$. By providing the nominal delay signal N as the output oscillation signal $OSC_{OUT}$, the output oscillation signal $OSC_{OUT}$, as provided to another ring oscillator to which the ring oscillator that includes the coupling stage 500 is cross-coupled, the output oscillation signal $OSC_{OUT}$ is not throttled by the oscillation signal $OSC_{CC}$ of the ring oscillator to which the coupling stage 500 is cross-coupled. In other words, the throttling of the output oscillation signal $OSC_{OUT}$ can be selectively disabled based on the enable signal EN being set to provide the output oscillation signal $OSC_{OUT}$ as the nominal delay signal N via the multiplexer 510. As an example, the enable signal EN can be provided as having a static logic value during operation of the Ising machine system for a given Ising problem, or can be provided dynamically during operation of the Ising machine system for the Ising problem.

As thus described in the example of FIG. 5, the coupling stage 500 demonstrates a variety of ways that the oscillation signal OSC of a given ring oscillator can be affected by the control signals CTL provided by the Ising machine controller 306. Particularly, by providing the delay selection signal DLY to set the propagation delay of the oscillation signal OSC through the coupling stage 500, the propagation period of the oscillation signal OSC through the ring oscillator can be controlled. Given that the coupling stage 500 can be one of a plurality X of coupling stages in a given ring oscillator, the net propagation period of the oscillation signal OSC at a given instant can be dictated (at least in part) by the separate delay selection signals provided to each of the coupling stages. Furthermore, by providing the delay selection signal DLY and by providing the enable signal EN, the coupling stage 500 can be selectively throttled by the other ring oscillator to which the ring oscillator that includes the coupling stage 500 is cross-coupled. Accordingly, the coupling stage 500 can provide greater control over the phase coupling between two cross-coupled ring oscillators.

Figure 6:
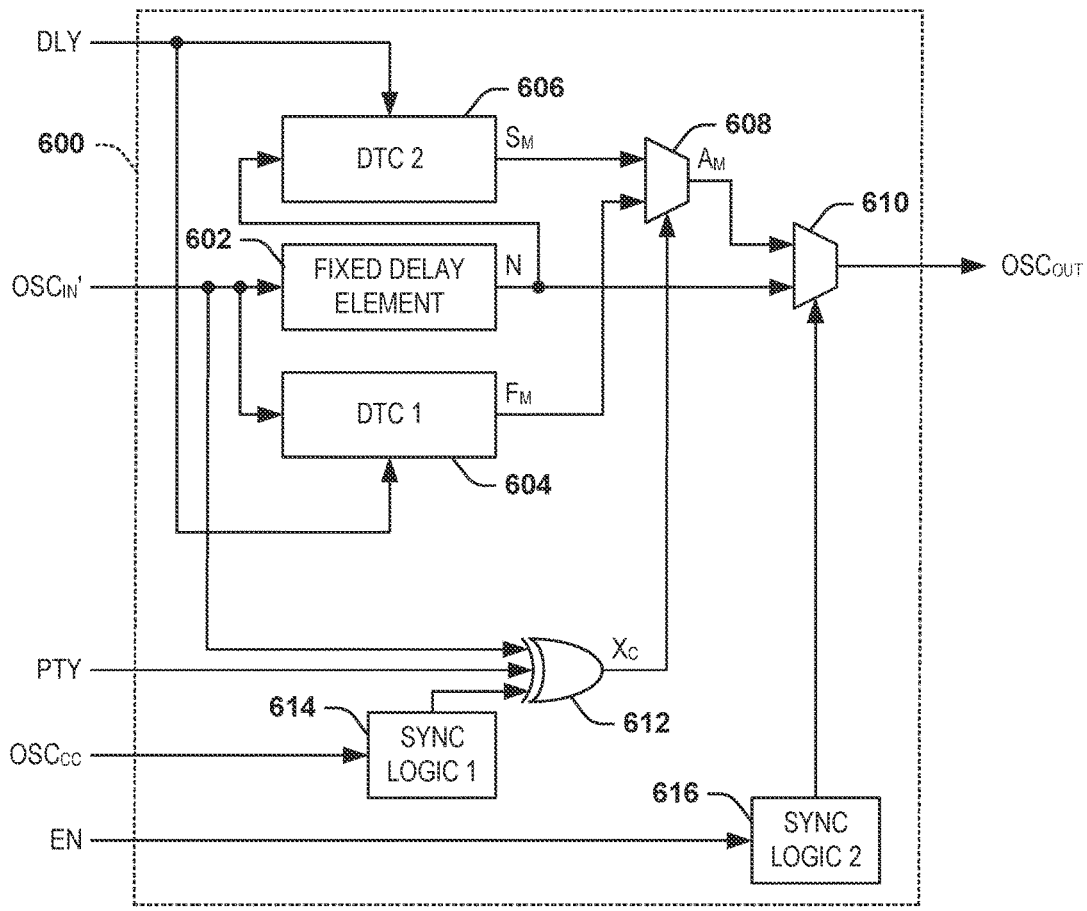
FIG. 6 illustrates another example diagram of a coupling stage.

FIG. 6 illustrates another example diagram of a coupling stage 600. The coupling stage 600 can correspond to the coupling stages 202 or the coupling stages 304 in the respective examples of FIGS. 2 and 3. Therefore, reference is to be made to the examples of FIGS. 2 and 3 in the following description of the example of FIG. 6.

The coupling stage 600 can be arranged similar to the coupling stage 500. However, instead of the delay line 502, the coupling stage 600 includes a fixed delay element 602, a first digital-to-time converter (DTC) 604, and a second DTC 606. The fixed delay element 602 receives an input oscillation signal $OSC_{IN}'$ that can correspond to an oscillation signal OSC' provided from an inverter (e.g., one of the inverters 204). The input oscillation signal $OSC_{IN}'$ is thus delayed by a nominal delay amount via the fixed delay element 602 to provide the input oscillation signal $OSC_{IN}'$ at a nominal delay, demonstrated by the signal N. Therefore, the nominal delay signal N corresponds to the input oscillation signal $OSC_{IN}'$ having been delayed by a nominal predetermined time duration.

The first DTC 604 likewise receives the input oscillation signal $OSC_{IN}'$ as an input, and is controlled by the delay selection signal DLY. The delay selection signal DLY can thus set an amount of delay provided by the first DTC 604, such as in different multiples "−D" of delay (relative to the nominal delay signal N), similar to as described above in the example of FIG. 5. For example, the delay selection signal DLY can be configured to activate a shunt-capacitor inverter or a current-starved inverter to provide the amount of delay through the first DTC 604. The first DTC 604 can provide an amount of delay that is less than the delay provided by the fixed delay element 602, even when the amount of delay set by the delay selection signal DLY is at a greatest amount. Therefore, the first DTC 604 is configured to provide the selected fast delay signal $F_M$ as an output.

The second DTC 606 receives the nominal delay signal N as an input, and is likewise controlled by the delay selection signal DLY. The delay selection signal DLY can thus set an amount of delay provided by the second DTC 606, such as in different multiples "+D" of delay (relative to the nominal delay signal N), similar to as described above in the example of FIG. 5. For example, the delay selection signal DLY can be configured to activate a shunt-capacitor inverter or a current-starved inverter to provide the amount of delay through the second DTC 606. Because the second DTC 606 receives the nominal delay signal N as an input, the amount of delay provided by the second DTC 606 is added to the nominal delay signal N. Therefore, the second DTC 606 is configured to provide the selected slow delay signal $S_M$ as an output.

The coupling stage 600 is otherwise similar to the coupling stage 500 in the example of FIG. 5. In the example of FIG. 6, the signals $F_M$ and $S_M$ are provided to a multiplexer 608 that is configured to select between the signals $F_M$ and $S_M$. Therefore, the multiplexer 608 selects between the selected fast delay signal $F_M$ and the selected slow delay signal $S_M$ to provide an adjusted delay signal $A_M$. The adjusted delay signal $A_M$ is provided to a fourth multiplexer 610 that is configured to select between the adjusted delay signal $A_M$ and the nominal delay signal N. Therefore, the multiplexer 610 selects between the adjusted delay signal $A_M$ and the nominal delay signal N to provide an output oscillation signal $OSC_{OUT}$. The output oscillation signal $OSC_{OUT}$ therefore corresponds to a delayed version of the input oscillation signal $OSC_{IN}'$.

The coupling stage 600 also includes an XOR gate 612 that is configured to generate a selection signal $X_C$. The selection signal $X_C$ is provided to the multiplexer 608 to provide the selection between the selected fast delay signal $F_M$ and the selected slow delay signal $S_M$ to provide the adjusted delay signal $A_M$. The XOR gate 612 receives the oscillation input signal $OSC_{IN}'$ at a first input and receives a polarity signal PTY at a second input. The polarity signal PTY can correspond to one of the control signals CTL that is provided from the Ising machine controller 306, and can define the polarity of the coupling stage 600 with respect to alignment or anti-alignment of the phase coupling of the respective ring oscillator with the cross-coupled ring oscillator. As an example, the polarity signal PTY can be set to a logic-1 to set the coupling stage 600 to phase align with the cross-coupled ring oscillator, or can be set to a logic-0 to set the coupling stage 600 to phase anti-align with the cross-coupled ring oscillator.

The XOR gate 612 also receives the oscillation signal $OSC_{CC}$ that is provided from the cross-coupled ring oscillator. Thus, the output oscillation signal $OSC_{OUT}$ and the oscillation signal $OSC_{CC}$ provided from the other cross-coupled ring oscillator can form a signal set of $TH_{YZ}$, as described above in the example of FIG. 4. In the example of FIG. 6, the oscillation signal $OSC_{CC}$ is provided to the XOR gate 612 through a first synchronous logic block ("SYNC LOGIC 1") 614, which can correspond to one or more flip-flop devices to mitigate metastability and/or logic glitches. Alternatively, the oscillation signal $OSC_{CC}$ can be provided directly to the XOR gate 612, such as to reduce chip fabrication area.

Therefore, in response to the oscillation input signal $OSC_{IN}'$, the polarity signal PTY, and the oscillation signal $OSC_{CC}$, the XOR gate 612 can provide the selection signal $X_C$ as an oscillation signal to provide the adjusted delay signal $A_M$ as oscillating between the selected fast delay signal $F_M$ and the selected slow delay signal $S_M$ to provide throttling of the coupling stage 600 based on the relative phases of the oscillation input signal $OSC_{IN}'$ and the oscillation signal $OSC_{CC}$. For example, in response to the polarity signal PTY being set to a state corresponding to phase alignment (e.g., logic-1), the oscillating adjusted delay signal $A_M$ is provided as the output oscillation signal $OSC_{OUT}$ (e.g., via the multiplexer 610, as described in greater detail herein) in a manner that attempts to align (e.g., converge) the phase of the output oscillation signal $OSC_{OUT}$ with the oscillation signal $OSC_{CC}$. Similarly, in response to the polarity signal PTY being set to a state corresponding to phase anti-alignment (e.g., logic-0), the oscillating adjusted delay signal $A_M$ is provided as the output oscillation signal $OSC_{OUT}$ in a manner that attempts to anti-align (e.g., diverge) the phase of the output oscillation signal $OSC_{OUT}$ with the oscillation signal $OSC_{CC}$. The convergence/divergence of the phase coupling of the output oscillation signal $OSC_{OUT}$ to the oscillation signal $OSC_{CC}$ can be an iterative process that can take an amount of time that is based on the weighting of the propagation delay of the oscillation output signal $OSC_{OUT}$ with respect to the input oscillation signal $OSC_{IN}'$, as set by the delay selection signal DLY. Therefore, the delay selection signal DLY can provide an additional layer of control over the phase coupling between cross-coupled ring oscillators.

The oscillating adjusted delay signal $A_M$ is provided as the output oscillation signal $OSC_{OUT}$ in response to one state of the multiplexer 610. In the example of FIG. 6, the multiplexer 610 is controlled by an enable signal EN that is provided to a second synchronous logic block ("SYNC LOGIC 2") 616. As an example, the second synchronous logic block 616 can correspond to one or more flip-flop devices to mitigate metastability and/or logic glitches. Alternatively, the enable signal EN can be provided directly to the multiplexer 610, such as to reduce chip fabrication area. The enable signal EN can be provided as one of the control signals CTL from the Ising machine controller 306.

The enable signal EN can thus set a state of the multiplexer 610 to provide either the oscillating adjusted delay signal $A_M$ as the output oscillation signal $OSC_{OUT}$ or the nominal delay signal N as the output oscillation signal $OSC_{OUT}$. By providing the nominal delay signal N as the output oscillation signal $OSC_{OUT}$, the output oscillation signal $OSC_{OUT}$, as provided to another ring oscillator to which the ring oscillator that includes the coupling stage 600 is cross-coupled, the output oscillation signal $OSC_{OUT}$ is not throttled by the oscillation signal $OSC_{CC}$ of the ring oscillator to which the coupling stage 600 is cross-coupled. In other words, the throttling of the output oscillation signal $OSC_{OUT}$ can be selectively disabled based on the enable signal EN being set to provide the output oscillation signal $OSC_{OUT}$ as the nominal delay signal N via the multiplexer 610. As an example, the enable signal EN can be provided as having a static logic value during operation of the Ising machine system for a given Ising problem, or can be provided dynamically during operation of the Ising machine system for the Ising problem.

As thus described in the example of FIG. 6, the coupling stage 600 demonstrates a variety of ways that the oscillation signal OSC of a given ring oscillator can be affected by the control signals CTL provided by the Ising machine controller 306. Accordingly, for similar reasons as described above regarding the example of FIG. 5, the coupling stage 600 can provide greater control over the phase coupling between two cross-coupled ring oscillators.

Figure 7:
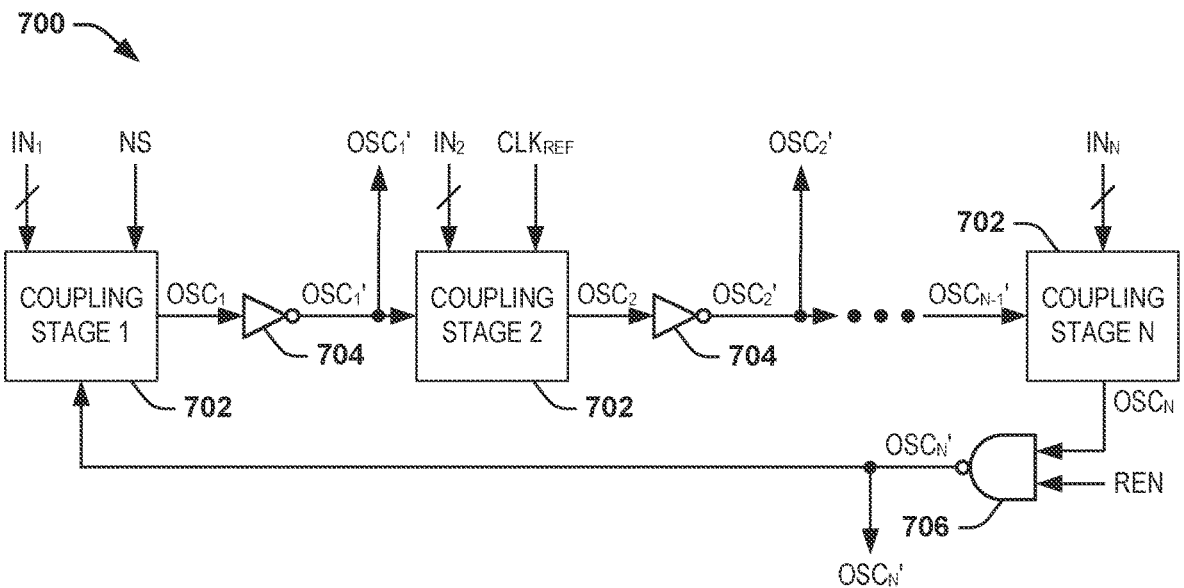
FIG. 7 illustrates another example diagram of a ring oscillator.

FIG. 7 illustrates another example diagram of a ring oscillator 700. The ring oscillator 700 can correspond to one of the ring oscillators 102 in the example of FIG. 1. Therefore, reference is to be made to the example of FIG. 1 in the following description of the example of FIG. 7.

The ring oscillator 700 is configured substantially similar to the ring oscillator 200 in the example of FIG. 2. Thus, the ring oscillator 700 includes a plurality N of coupling stages 702, where N is a positive integer. The coupling stages 702 are each interconnected by an inverter 704, which can be implemented as a CMOS inverter (e.g., with complementary pull-up and pull-down transistor switches). The ring oscillator 700 is configured to propagate an oscillation signal OSC. As an example, N can be an odd integer, such that the oscillation signal OSC is inverted from one oscillation period to a next oscillation period.

In the example of FIG. 7 as oscillation signals $OSC_1$ through $OSC_N$ provided from the coupling stages 702, and as oscillation signals $OSC_1'$ and $OSC_N'$ as provided from the inverters 704. Thus, a given Yth oscillation signal $OSC_Y'$ corresponds to an inverted version of the respective Yth oscillation signal $OSC_Y$. Furthermore, a given Yth oscillation signal $OSC_Y$ provided from the Yth coupling stage 702 corresponds to the oscillation signal $OSC_{Y-1}'$ that is provided as an input to the respective Yth coupling stage 702. As described herein, the coupling stages 702 can provide a variable propagation delay of the oscillation signal $OSC_{Y-1}'$ to provide the oscillation signal $OSC_Y$.

Additionally, each of the coupling stages 702 is demonstrated as receiving a set of input signals IN, demonstrated as $IN_1$ through $IN_N$. The input signals IN can each include an oscillator signal OSC provided from a coupling stage of another ring oscillator 102. The input signals IN can also include a set of the control signals CTL provided from the Ising machine controller 104. As described above, the control signals CTL, and thus each of the sets of input signals IN, can include a delay selection signal that can affect a propagation delay of the oscillator signal OSC through the coupling stage 702. The delay selection signal can thus affect an amount of delay between the oscillation signal $OSC_{Y-1}'$ and the oscillation signal $OSC_Y$, and thus the amount of propagation delay of the oscillation signal OSC through the respective one of the coupling stages 702. As an example, each of the coupling stages 702 can exhibit a nominal delay of the oscillation signal OSC, and can include variable delay that can be set by the delay selection signal to provide for a faster propagation (e.g., less delay) or slower propagation (e.g., more delay) of the oscillation signal OSC through the respective coupling stage 702. The overall propagation delay of the oscillation signal OSC (e.g., the time duration of N oscillations) about the ring oscillator 700 is thus defined by the net propagation delay of each of the coupling stages 702 at a given instant, as provided by the respective delay selection signals.

In addition, in the example of FIG. 7, the ring oscillator 700 includes a NAND gate 706 that interconnects the Nth coupling stage 702 and the first coupling stage 702. The NAND gate 706 receives the oscillation signal $OSC_N$ at a first input, and also receives a ring oscillator enable signal REN at a second input. The ring oscillator enable signal REN can correspond to an enable signal for the entire ring oscillator 700, such that the ring oscillator 700 can be selectively enabled and disabled with respect to propagating the oscillation signal OSC. As an example, the ring oscillator enable signal REN can be provided as one of the control signals CTL that is provided from the Ising machine control system 104 to the ring oscillator 700. Therefore, in response to assertion of the ring oscillator enable signal REN, the ring oscillator 700 can provide the oscillation signal OSC as described herein. However, in response to de-assertion of the ring oscillator enable signal REN, the ring oscillator 700 can be disabled, such that the oscillation signal OSC ceases propagation (e.g., maintains a logic-zero state between each of the coupling stages 702).

In addition, in the example of FIG. 7, the first coupling stage ("COUPLING STAGE 1") 702 is demonstrated as receiving a simulated noise signal NS. As an example, the simulated noise signal NS can be provided to the XOR gate 512 or 612 of the coupling stages 500 or 600, respectively, instead of the oscillation signal $OSC_{CC}$ from another ring oscillator. As an example, to provide for a more optimal phase response curve in the operation of the first coupling stage 702 and/or to provide for a more independent noise effect of the simulated noise signal NS, the input oscillation signal $OSC_{IN}'$ can be decoupled (e.g., disabled) from the XOR gate 512 or 612. The simulated noise signal NS can correspond to a high-speed signal that has a simulated noise signal characteristic, such that the first coupling stage 702 can attempt to phase-couple to simulated noise. Thus, the simulated noise signal NS can introduce an element of randomness into a given Ising problem. As an example, the simulated noise signal NS can be provided from the Ising machine controller 306 as one of the control signals CTL that is provided to any (zero or more) of the coupling stages 304 of any (zero or more) of the ring oscillators 302.

Additionally or alternatively, the simulated noise signal NS can be implemented to simulate an analog signal. For example, the simulated noise signal characteristic can correspond to at least one of pulses of different frequencies and/or different pulse lengths, such as to simulate an analog characteristic of the simulated noise signal NS. Thus, for a simulated analog characteristic between a digital zero and a digital one, the simulated analog characteristic can correspond to increasing frequency and/or pulse width of pulses from the digital zero to the digital one. Therefore, the variation of pulse frequency and/or the pulse width of the simulated noise signal can provide a time-average that can simulate an appropriate analog amplitude of the simulated noise signal NS. Accordingly, the simulated noise signal NS can be implemented as an additional manner of providing flexibility in solving a complex Ising problem.

As also demonstrated in the example of FIG. 7, the second coupling stage ("COUPLING STAGE 2") 702 is demonstrated as receiving a reference clock signal $CLK_{REF}$. As an example, the reference clock signal $CLK_{REF}$ can be provided to the XOR gate 512 or 612 of the coupling stages 500 or 600, respectively, instead of the oscillation signal $OSC_{CC}$ from another ring oscillator. The reference clock signal $CLK_{REF}$ can correspond to a clock signal having a predetermined frequency, such that the second coupling stage 702 can attempt to phase-couple to the reference clock signal $CLK_{REF}$. For example, the reference clock signal $CLK_{REF}$ can be implemented for providing the $h_i$ term (e.g., local field) of the Hamiltonian with respect to the Ising problem, or can be implemented to perform sub-harmonic injection locking. While the example of FIG. 7 demonstrates a single reference clock signal $CLK_{REF}$ being provided to the ring oscillator 700, multiple reference clock signals $CLK_{REF}$ can be provided to a given ring oscillator, with the multiple reference clock signals $CLK_{REF}$ having different frequencies (e.g., a first reference clock signal $CLK_{REF}$ having a given frequency and a second reference clock signal $CLK_{REF}$ having a first harmonic frequency of the given frequency). Thus, the reference clock signal $CLK_{REF}$ can introduce another element into a given Ising problem that is static (e.g., unrelated to the oscillation signal(s) of other ring oscillators). As an example, the reference clock signal $CLK_{REF}$ can be provided from the Ising machine controller 306 as one of the control signals CTL that is provided to any (zero or more) of the coupling stages 304 of any (zero or more) of the ring oscillators 302.

The addition of the simulated noise signal NS and/or the reference clock signal $CLK_{REF}$ can be provided to any (zero or more) of the coupling stages 702 of the ring oscillator 700, while the remaining coupling stages 702 can be cross-coupled to other coupling stages of other ring oscillators, as described above. Therefore, the ring oscillator 700, and other ring oscillators of the associated Ising machine system, can be arranged in a variety of different ways to exhibit greater flexibility in solving an Ising problem.

Figure 8:
FIG. 8 illustrates an example of a method for solving an Ising problem.

In view of the foregoing structural and functional features described above, a methodology in accordance with various aspects of the disclosure will be better appreciated with reference to FIG. 8. It is to be understood and appreciated that the method of FIG. 8 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 8 illustrates an example of a method 800 for solving an Ising problem.

At 802, an Ising machine system (e.g., the Ising machine system 100) is provided comprising a plurality of CMOS ring oscillators (e.g., the ring oscillator 200) that are each configured to propagate an oscillation signal (e.g., the oscillation signal OSC). Each of the CMOS ring oscillators can be cross-coupled with at least one other of the CMOS ring oscillators via a respective one of the oscillation signals to provide a respective phase coupling between the respective cross-coupled CMOS ring oscillators. At 804, a set of control signals (e.g., the control signals CTL) corresponding to parameters of an Ising problem are provided to each of the CMOS ring oscillators. Each of the sets of control signals include a delay selection signal (e.g., the delay selection signal DLY) configured to set a variable propagation delay of the respective one of the CMOS ring oscillators to control the relative phase coupling of each of the CMOS ring oscillators to each of the at least one other of the CMOS ring oscillators.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An Ising machine system comprising:
a plurality of ring oscillators that are each configured to propagate an oscillation signal, each of the ring oscillators being cross-coupled with at least one other of the ring oscillators via a respective one of the oscillation signals to provide a respective phase coupling between the respective cross-coupled ring oscillators; and
an Ising machine controller configured to generate a plurality of control signals corresponding to parameters of an Ising problem, the control signals comprising a plurality of delay selection signals, the Ising machine controller providing at least one of the delay selection signals to each of the ring oscillators, the delay selection signal being configured to set a variable propagation delay of the ring oscillator to control the relative phase coupling of each of the ring oscillators to each of the at least one other of the ring oscillators.

2. The system of claim 1, wherein each of the ring oscillators comprises a plurality of coupling stages, each of the coupling stages being configured to receive a set of the control signals comprising a respective one of the delay selection signals, such that each of the ring oscillators has a net oscillation period of the respective oscillation signal at a given instant that is set based on the delay selection signal provided to each of the coupling stages of the respective one of the ring oscillators.

3. The system of claim 2, wherein each of the ring oscillators is cross-coupled with the at least one other of the ring oscillators via the respective one of the oscillation signals provided from one of the respective coupling stages associated with the respective one of the ring oscillators and received from a respective one of the coupling stages associated with the respective at least one other of the ring oscillators to provide the respective phase coupling between the respective cross-coupled ring oscillators.

4. The system of claim 2, wherein each set of the control signals comprises an enable signal that is provided to each of coupling stages of the respective one of the ring oscillators, the enable signal being configured to select between a nominal propagation delay and the variable propagation delay of a respective one of the coupling stages.

5. The system of claim 2, wherein each set of the control signals comprises a cross-coupling polarity signal that is provided to each of coupling stages of the respective one of the ring oscillators, the cross-coupling polarity signal being configured to select between phase alignment and phase anti-alignment of the ring oscillator relative to the other cross-coupled at least one of the ring oscillators associated with the respective one of the coupling stages.

6. The system of claim 2, wherein each of the coupling stages comprise a first digital-to-time converter and a second digital-to-time converter that are each configured to receive the delay selection signal, wherein each of the coupling stages is configured to provide one of a fast oscillation in which the oscillation signal passes through neither of the first or second digital-to-time converters, a nominal oscillation in which the oscillation signal passes through the first digital-to-time converter but not the second digital-to-time converter, and a slow oscillation in which the oscillation signal passes through both of the first or second digital-to-time converters.

7. The system of claim 2, wherein each of the coupling stages comprises:
a delay register that is configured to provide a plurality of copies of the oscillation signal that are each delayed by a different amount; and
at least one multiplexer configured to select one of the copies of the oscillation signal based on the delay selection signal.

8. The system of claim 2, wherein each set of the control signals comprises a clock signal having a predetermined frequency to provide phase coupling of the respective one of the ring oscillators to the clock signal.

9. The system of claim 2, wherein each set of the control signals comprises a simulated noise signal having a simulated noise signal characteristic to provide phase coupling of the respective one of the ring oscillators to simulated noise.

10. The system of claim 9, wherein the simulated noise signal characteristic comprises one of a pulse frequency and a pulse width to simulate an analog characteristic associated with the simulated noise signal.

11. The system of claim 1, wherein each of the ring oscillators are fabricated as complementary metal-oxide semiconductor (CMOS) ring oscillators.

12. A method for solving an Ising problem, the method comprising:
providing an Ising machine system comprising a plurality of complementary metal-oxide semiconductor (CMOS) ring oscillators that are each configured to propagate an oscillation signal, each of the CMOS ring oscillators being cross-coupled with at least one other of the CMOS ring oscillators via a respective one of the oscillation signals to provide a respective phase coupling between the respective cross-coupled CMOS ring oscillators; and
providing a set of control signals corresponding to parameters of an Ising problem to each of the CMOS ring oscillators, each of the sets of control signals comprising a delay selection signal configured to set a variable propagation delay of the respective one of the CMOS ring oscillators to control the relative phase coupling of each of the CMOS ring oscillators to each of the at least one other of the CMOS ring oscillators.

13. The method of claim 12, wherein providing the set of control signals comprises providing the set of control signals to each of a plurality of coupling stages of each of the CMOS ring oscillators, such that each of the CMOS ring oscillators has an oscillation period of the respective oscillation signal that is set based on the delay selection signal provided to each of coupling stages of the respective one of the CMOS ring oscillators.

14. The method of claim 13, wherein providing the set of control signals comprises providing an enable signal to each of a plurality of coupling stages of each of the CMOS ring oscillators, the enable signal being configured to select between a nominal propagation delay and the variable propagation delay of a respective one of the coupling stages.

15. The method of claim 13, wherein providing the set of control signals comprises providing a cross-coupling polarity signal to each of a plurality of coupling stages of each of the CMOS ring oscillators, the cross-coupling polarity signal being configured to select between phase alignment and phase anti-alignment of the CMOS ring oscillator relative to the other cross-coupled at least one of the CMOS ring oscillators associated with the respective one of the coupling stages.

16. The method of claim 13, wherein providing the set of control signals comprises providing at least one of a clock signal and a simulated noise signal to each of a plurality of coupling stages of each of the CMOS ring oscillators, wherein the clock signal has a predetermined frequency to provide phase coupling of the respective one of the CMOS ring oscillators to the clock signal, wherein the simulated noise signal has a simulated noise signal characteristic to provide phase coupling of the respective one of the CMOS ring oscillators to simulated noise.

17. An Ising machine system comprising:
a plurality of ring oscillators that are each configured to propagate an oscillation signal, each of the ring oscillators comprises a plurality of coupling stages, each of the ring oscillators being cross-coupled with at least one other of the ring oscillators via the respective one of the oscillation signals provided from one of the respective coupling stages associated with the respective one of the ring oscillators and received from a respective one of the coupling stages associated with the respective at least one other of the ring oscillators to provide the respective phase coupling between the respective cross-coupled ring oscillators; and
an Ising machine controller configured to generate a plurality of sets of control signals corresponding to parameters of an Ising problem, each of the sets of control signals comprising a delay selection signal associated with a variable propagation delay, the Ising machine controller providing each set of the control signals to each of the coupling stages of each of the ring oscillators, such that each of the ring oscillators has a net oscillation period of the respective oscillation signal at a given instant that is set based on the variable oscillation provided by the respective delay selection signal at each of the coupling stages of the respective one of the ring oscillators to control the relative phase coupling of each of the ring oscillators to each of the at least one other of the ring oscillators.

18. The system of claim 17, wherein each set of the control signals comprises an enable signal that is provided to each of coupling stages of the respective one of the ring oscillators, the enable signal being configured to select between a nominal propagation delay and the variable propagation delay of a respective one of the coupling stages.

19. The system of claim 17, wherein each set of the control signals comprises a cross-coupling polarity signal that is provided to each of coupling stages of the respective one of the ring oscillators, the cross-coupling polarity signal being configured to select between phase alignment and phase anti-alignment of the ring oscillator relative to the other cross-coupled at least one of the ring oscillators associated with the respective one of the coupling stages.

20. The system of claim 17, wherein each set of the control signals comprises at least one of:
- a clock signal having a predetermined frequency to provide phase coupling of the respective one of the ring oscillators to the clock signal; and
- a simulated noise signal having a simulated noise signal characteristic to provide phase coupling of the respective one of the ring oscillators to simulated noise.

* * * * *